United States Patent [19]

Bishop

[11] Patent Number: 4,749,938
[45] Date of Patent: Jun. 7, 1988

[54] METER TAMPERING DETECTION DEVICE

[75] Inventor: Roy Bishop, Port Colborne, Canada

[73] Assignee: Micro-Port International Ltd., Canada

[21] Appl. No.: 46,740

[22] Filed: May 7, 1987

[30] Foreign Application Priority Data

May 12, 1986 [CA] Canada ................................. 508951

[51] Int. Cl.⁴ .......................... G01R 11/24; G09F 9/00
[52] U.S. Cl. .................................. 324/110; 116/200; 116/278; 292/307 R
[58] Field of Search .................. 324/110, 156; 73/431; 116/200, 81, 278, 307; 40/21 R; 292/307 R, 317; 340/568, 570; 206/807; 361/364, 369

[56] References Cited

U.S. PATENT DOCUMENTS 2,199,348  4/1940  Rubinoff ............................ 40/21 R
3,513,801  5/1970  Osorio ................................ 116/200
4,588,949  5/1986  Becker et al. ....................... 324/110

Primary Examiner—Ernest F. Karlsen
Attorney, Agent, or Firm—Larson and Taylor

[57] ABSTRACT

A meter tampering detection device, comprising a sealed housing adapted to be installed in the cover of a utility meter, a supply of flexible tape in said housing having a graduated scale which changes as the tape is withdrawn from the housing, an aperture in the housing through which the free end of the tape is passed, said tape being arranged so that it can be withdrawn from the housing by exerting a pull on the free end, and said tape being arranged and having a flexibility such that it cannot be pushed back into the housing once withdrawn, and gripping means for installation on a fixed part of the meter for gripping the free end of the tape such that said tape is withdrawn from the housing as the cover is removed.

12 Claims, 1 Drawing Sheet

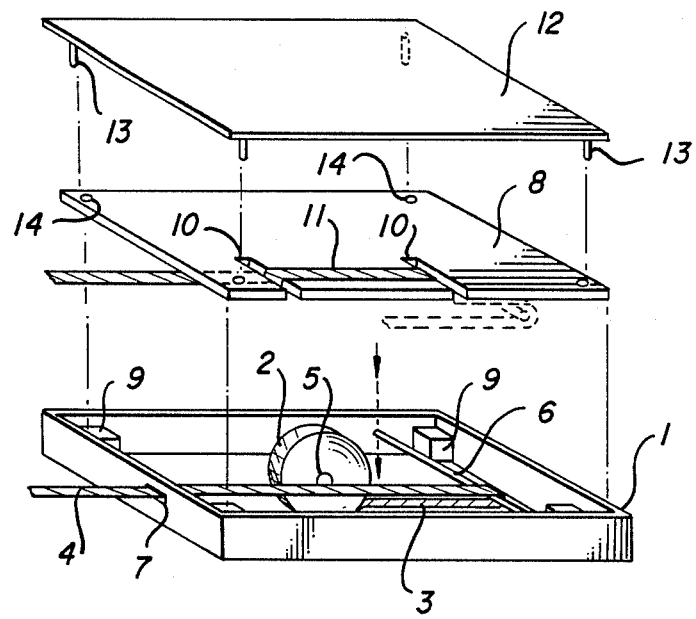
Fig. 1
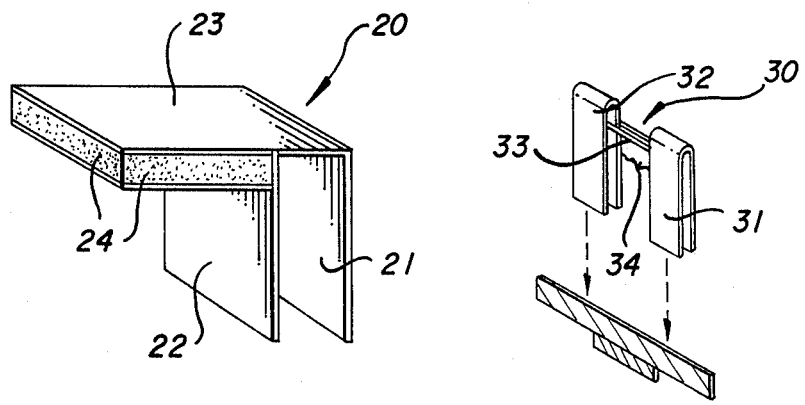
Fig. 2a
Fig. 2b

METER TAMPERING DETECTION DEVICE

This invention relates to a meter tampering detection device for installation in utility meters, such as electricity meters.

The theft of electricity by meter tampering is a major problem in North America. It has been estimated that approximately 400 million dollars is lost annually as a result of meter tampering. Most electricity meters have a wall-mounted base, into which the cover and the meter mechanism are inserted. The meter mechanism has a number of protruding pins that engage corresponding sockets in the base. Meter tamperers will often break the seal and either temporarily jam the meter mechanism, or in some cases invert the meter so that the meter count actually decreases. Sometimes the tamperer will claim that the seal was inadvertently damaged, in which case the tampering is hard to prove, and sometimes the tamperer will have access to a utility die so that he can re-seal the meter. Efforts to discourage electricity theft have so far met with relatively little success.

In view of the larger number of meters in use, any effective device for detecting meter tampering should be simple to make and low in cost. In theory, electronic monitoring devices could be installed but their cost could not be justified on a mass scale.

An object of the present invention is to provide a low cost device for discouraging and indicating meter tampering.

According to the present invention that is provded, a meter tampering detection device, comprising a sealed housing adapted to be installed in the cover of a utility meter, a supply of flexible tape in said housing having a graduated scale which changes as the tape is withdrawn from the housing, an aperture in the housing through which the free end of the tape is passed, said tape being arranged so that it can be withdrawn from the housing by exerting a pull on the free end, and said tape being arranged and having a flexibility such that it cannot be pushed back into the housing once withdrawn, and gripping means for installation on a fixed part of the meter for gripping the free end of the tape such that said tape is withdrawn from the housing as the cover is removed.

The tampering device can be molded at low cost from plastic. It is designed to be installed in the cover of a meter, preferably an electricity meter although it could be installed in other types of meter with a removable cover. The housing is located normally in the region of the nameplate of a conventional meter, adjacent to the dials, so that a window showing the graduated tape is visible from the outside. The graduations will normally be simple reference numbers, so that the number showing in the window can be seen from outside the meter. The flexible tape is fed through a hole drilled in the base of the meter mechanism so that it dangles freely. The gripping means is installed on the meter base and the free end of the tape passed through. As the meter mechanism is inserted into the base, the tape is pulled taut by the installer against the friction of the gripping means. The number visible in the window is then recorded. In the event that the meter cover mechanism is removed, owing to the fact that the frictional force applied to the tape by the gripping means is greater than the force required to withdraw the tape from the housing, the tape comes out of the housing and the number visible in the window changes. Unauthorized removal of the meter can thus be detected by noting the change in the number visible in the window of the detection device housing.

The tape can be made of paper or some other tearable material so that the surplus can be torn off. Whatever material is used, it should have sufficient flexibility to prevent it from being pushed back into the housing.

The invention will now be described in more detail, by way of example only, with reference to the accompanying drawings, in which:

FIG. 1 is an exploded view of a housing for a meter tampering detection device in accordance with the invention; and FIGS. 2a and 2b show gripping means for attachment to a meter base.

The meter tampering detection device comprises a shallow rectangular box 1 containing a roll 2 of paper tape 3 graduated with sequentially numbered marks 4. The roll 2 is mounted on a central post 5 allowing it to be unwound. The free end of the tape passes over bar 6 extending across one end of the interior of the housing 3 and out through a small aperture 7 in an end wall of the housing. A lid 8 is recessed into the top of the housing and rests on post 9 in each corner.

The lid 8 has a pair of slits 10 extending part way across the lid from one edge. The tape 3 is passed out of the housing through one of the slits and back in through the other so that a length 11 is exposed. A transparent cover 12 with pegs 13 is then placed over the lid 8, with the pegs 13 engaging in hole 14 at each corner of the lid 8.

The housing is sealed so that it cannot be opened without damaging it. The tape 3, which is conveniently of paper or some other tearable material, is sufficiently flexible so that it cannot be pushed back into the housing, once withdrawn. Once the numbers visible through the window, formed by the region between the slits 10, have changed, by virtue of the face that a length of tape is being pulled from the housing, it is not possible to return the original numbers to the window without damaging the housing.

FIGS. 2a and 2b show gripping devices for ringless and ring-type meters. A ringless meter generally has an open box-shaped base into which the meter cover and mechanism is inserted. The metal plate with a round pole through which the meter cover protrudes closes the box shaped housing.

In a ring-type meter, the mounting base has a protruding sleeve with an outward turned lid into which the meter mecahanism and cover is inserrted. A ring is then placed around a flange on the meter cover the the outwardly turned lip. The ring is sealed with the standard utility seal.

For ringless meters, the gripping device 20, shown in FIG. 2a, is placed with its parallel legs 21, 22 seated over the wall of the box-shaped housing and flip top plates 23 extending into the box shaped housing forming the meter mounting base. A magnet 24 is attached to the lower side of the top-plate throat 23 on the inside of the legs 21, 22. The mounting base cover plate is placed on the mounting base in a butting relationship with the top plate 23. The free end of the tape is passed between the top plate 23 and the cover plate (not shown). The cover plates will be of metal, and thus the cover plate and top plate exert a frictional force on the tape. When the meter is installed, the tape can be pulled taut, but when the meter is removed this frictional force is greater than the force required to draw the tape out of the housing 1, so the numbers visible in the window change.

FIG. 2b shows a ring-type gripping device. This comprises a clip 30 with two resilient u-shaped portions 31, 32 that fit over the lip of the mounting base sleeve. The two u-shaped portions 31, 32 are inter-connected by a cross piece 33 bearing on its lower side a piece of friction material 34, such as sponge. When the meter cover and mechanism is installed into the mounting base, the tape is passed under the cross-piece 33 in contact with the sponge. The sponge frictionally engages the tape but allows the tape to be drawn through the clip when a limiting frictional force is exceeded. As the meter mechanism is installed in the mounting base, the tape is pulled taut and the number in the window recorded. When the cover and mechanism are removed, the tape is pulled out of the housing 1 so that the numbers visible in the window change. Thus, any unauthorized attempt at removing the meter cover and mechanism will be readily apparent.

The described device meets the requirement of providing a low cost tamper detector that can be conveniently installed on a mass scale. The device can be made for less than $2 a unit. The installation on the face of the meter mechanism can be quickly performed. The high visibility of the device also makes it less likely that a customer will attempt unauthorized removal of the meter, since the customer is also able to see the numbers visible in the window.

In the described device, the tape is read directly by the reader since it is visible in the window. In an alternative embodiment, the role of tape can be made to drive a geared counter or some form of dials such a linear or circular dial.

The embodiments of the invention in which an exclusive property of privilege is claimed are defined as follows:

1. A meter tampering detection device, comprising a sealed housing adapted to be installed in the cover of a utility meter, a supply of flexible tape in said having a graduated scale which changes as the tape is withdrawn from the housing, an aperture in the housing through which the free end of the tape is passed, said tape being arranged so that it can be withdrawn from the housing by exerting a pull on the free end, and said tape being arranged and having a flexibility such that it cannot be pushed back into the housing once withdrawn, and gripping means for installation on a fixed part of the meter for gripping the free end of the tape such that said tape is withdrawn from the housing as the cover is removed.

2. A meter tampering detection device as claimed in claim 1 wherein the graduated scale is provided on said tape which has a length passing through a window, said length being visible from outside the housing.

3. A meter tampering detection device as claimed in claim 2 wherein said gripping means comprises a friction device which allows the tape to be pulled there through when a limiting force is exceeded, said friction device exerting a frictional force on the tape greater than the force required to pull the tape from the housing, whereby during installation of the meter mechanism the tape can be pulled tight by drawing it through the friction device or upon removal of the meter mechanics from the moutning base the tape is withdrawn from the housing.

4. A meter tampering detection device as claimed in claim 3 wherein the housing comprises a shallow rectangular-box with a pair of space slits in one wall thereof, the tape being passed out through one slit and back into the box through the other slit, with the graduations on the lengths of tape between the slits being exposed.

5. A meter tampering detection device as claimed in claim 4 comprising a transparent panel located over said wall between the slits.

6. A meter tampering detection device as claimed in claim 5 wherein said transparent panel extends over the whole wall containing said slits.

7. A meter tampering detection device as claimed in claim 6 wherein said tape is coiled up within said housing.

8. A meter tampering detection device as claimed in claim 6 wherein said aperture is located at one end of the housing and said tape extends over a bar at the other end of the housing prior to passing through said slits.

9. A meter tampering detection device as claimed in claim 1 wherein said tape is tearable.

10. A meter tampering detection device as claimed in claim 3 for ring-type detecting meter where said gripping means comprises a clip adapted to be fitted over a rim of the meter-base and having a piece of friction material for engaging the tape.

11. A meter tampering detection device as claimed in claim 10 for ringless type electricity meters wherein the gripping means comprises a magnet adapted to be located in the meter base, and a plate attracted to said magnet, said tape being passable between said magnet and plate.

12. An electricity meter having installed therein a meter tampering detection device as claimed in claim 1.

* * * * *